United States Patent [19]

Lavi

[11] 4,377,855
[45] Mar. 22, 1983

[54] CONTENT-ADDRESSABLE MEMORY
[75] Inventor: Yoav Lavi, Raanana, Israel
[73] Assignee: National Semiconductor Corporation, Santa Clara, Calif.
[21] Appl. No.: 204,685
[22] Filed: Nov. 6, 1980
[51] Int. Cl.³ .............................................. G11C 15/00
[52] U.S. Cl. ...................................... 365/49; 365/202
[58] Field of Search ............................ 365/49, 50, 202
[56] References Cited
U.S. PATENT DOCUMENTS
4,254,476 3/1981 Burrows ................................ 365/49

Primary Examiner—Terrell W. Fears
Attorney, Agent, or Firm—Gail W. Woodward; Paul J. Winters; Neil B. Schulte

[57] ABSTRACT

A content-addressable memory (CAM) has an array of four-transistor memory cells arranged in rows corresponding to stored words and columns corresponding to a selected search word. Complementary column lines couple signals associated with the bits of the search word to the memory cells associated with all of the stored words in parallel. The memory cells of each row are coupled to a common sense line and cause a current to flow on the sense line in response to the search word not matching the data word associated with that row.

Writing is accomplished by discharging one of the sense lines and applying signals representative of the desired word to be stored to the column lines. Since the ground lines are not unique to any row, they can be shared between adjacent rows or columns as best suits the layout of the circuit.

A status bit is associated with each stored word and is used to selectively activate the sense amplifier associated with each row. The status bit is responsive to the signal on sense line and a separate control line, thus, simple comparisons can be used to selectively activate sense amplifiers.

Finally, a unique control circuit associated with the most significant bit allows a selected segment of the content-addressable memory to be activated.

12 Claims, 7 Drawing Figures

CONTENT-ADDRESSABLE MEMORY

BACKGROUND OF THE INVENTION

1. Field of the Invention

The present invention relates to content addressable memory (CAM) arrays. More specifically, the present invention relates to a content addressable semiconductor memory array in which a single line is used for supplying power and for sensing signals associated with each row.

2. Background of the Invention

Content-addressable memories simultaneously compare a search word with a plurality of stored words. If a search word matches a stored word, an indication of the match and which of the stored words was matched is provided. A significant distinguishing characteristic of a content-addressable memory is that each stored word is uniquely identified on the basis of the value of the information stored, rather than by the address of the stored word as in conventional digital memories. Since the search word is compared to all stored words in parallel, the time needed to compare a search word to a number of stored words, known as the memory search time, is significantly reduced relative to conventional digital memories.

In operation, each bit of each stored word is stored in a discrete memory cell. Signals representative of the bits of a search word are simultaneously applied to the memory cells storing the corresponding bits of the stored words. The memory cells corresponding to a stored word are interconnected to a single sense line for providing a signal on this line in response to the stored word matching the search word. An illustrative example of a prior art CAM can be found in "Integrated-Circuit Content-Addressable Memories" by James T. Koo, IEEE J. Solid-State Circuits, vol. SC-5, pp. 208–215, October 1970.

SUMMARY OF THE INVENTION

The preferred embodiment of the present invention comprises an array of memory cells arranged in columns corresponding to bits of a search word and rows corresponding to bits of stored data words. Each memory cell comprises a cross-coupled inverter coupled between a supply line and a ground line. Writing is accomplished by discharging a selected supply line and applying complementary signals to the inputs of the inverters in response to the desired data to be stored. Comparison is accomplished by applying a non-forcing high voltage to the supply line, applying complementary signals to the inputs of the inverters in response to the bits of a search word, and sensing the flow of current through the supply lines. The absence of current on the supply line corresponds to a match between the search word and the associated stored word.

In one embodiment of the invention a control bit selectively gates the output signal and is itself selectively responsive to the output signal; thus, selected stored words can be effectively purged.

Finally, in another feature of the preferred embodiment, a plurality of of control bits can be set simultaneously.

DETAILED DESCRIPTION OF THE PREFERRED EMBODIMENT

Figure 1:
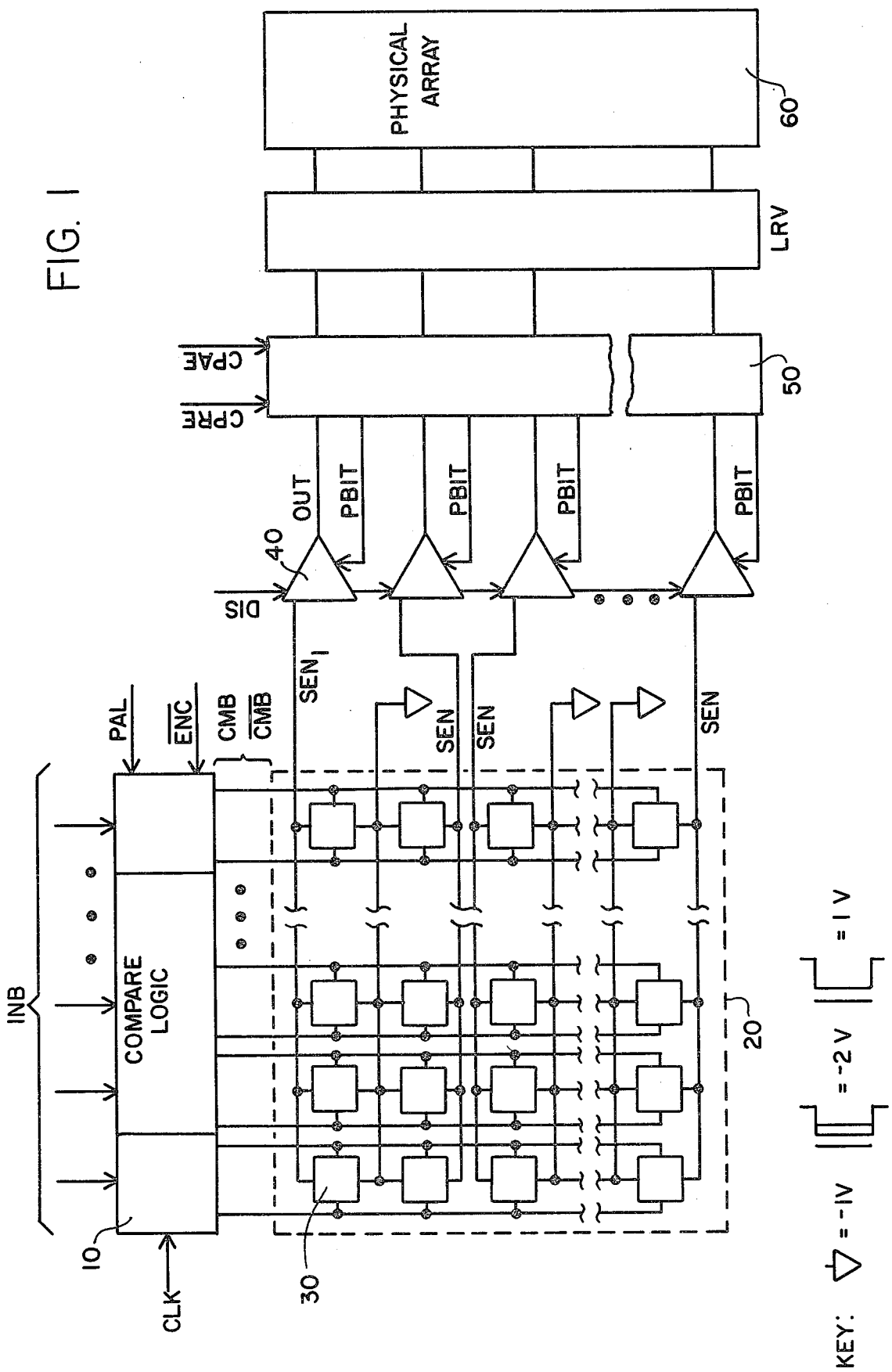
FIG. 1 is a block diagram of a content-addressable memory (CAM) used in a circuit for translating virtual to absolute addresses in accordance with the preferred embodiment of the present invention.

The preferred embodiment of the present invention is a content-addressable memory (CAM) coupled to a RAM for providing fast translations of virtual to absolute addresses. More particularly, a content-addressable memory stores thirty-two (32) 16-bit data words. A block diagram of the preferred embodiment of the present invention is illustrated in FIG. 1. A 16-bit virtual address is received on an input bus INB. This virtual address, a clock signal CLK, a control line PAL and a control line $\overline{ENC}$ are applied to compare logic 10. Compare logic 10 selectively provides signals on the sixteen pairs of complementary bus lines CMB and $\overline{CMB}$ in response to the signals received on input bus INB. In a compare mode of operation, each of the sixteen pairs of control lines CMB/$\overline{CMB}$ provide complementary signals indicating the status of a corresponding bit of the 16-bit virtual address. These control lines are coupled to corresponding columns of four-transistor memory cells 30 which make up the CAM array 20. Memory cells 30 are coupled in logical rows and columns with each row corresponding to a stored data word. Each column corresponds to a bit position in a 16-bit word, thus, the preferred content-addressable memory stores thirty-two (32) 16-bit words and has thirty-two (32) rows and sixteen (16) columns. Memory cells 30 in each column are coupled to receive a common pair of CMB/$\overline{CMB}$ input lines, and memory cells 30 in each row are coupled to a common output line SEN. Further, the present architecture provides for sequential pairs of rows to share common ground lines as described below.

A current flowing on an output line SEN corresponds to a match between the virtual address on input bus INB and the stored word associated with that SEN line. In illustration, sense line SEN$_1$ is coupled to sense amplifier 40 which detects the presence or absence of a current on sense line SEN$_1$. Sense amplifier 40 also receives a control signal DIS which selectively causes sense amplifier 40 to discharge sense line SEN$_1$ to ground. Otherwise, sense amplifier 40 biases sense line SEN$_1$ to a nonforcing high-level voltage of approximately two (2) threshold voltages ($2V_{th}$) as described more fully below. Further, sense amplifier 40 is coupled to a control line PBIT and is selectively deactivated in response to receiving a logical "zero" on control line PBIT. Each sense line is coupled to a corresponding sense amplifier. Each sense amplifier is coupled to a PBIT logic circuit 50 which is coupled to control lines CPRE and CPAE. PBIT logic circuit 50 contains one bit of data known as the "PBIT" for each stored data word. A logical "one" enables the sense amplifier for the corresponding stored data word. A logical "zero" disables the sense amplifier for that stored data word, indicating that the stored word associated with that PBIT is not to be compared to the virtual address on input line INB. The status of the PBIT itself is set in response to output signal OUT from the associated sense amplifier and the values of control signals CPRE and CPAE. Output lines OUT from the sense amplifiers are also coupled to the address lines of a RAM 60 for addressing the data word associated with the absolute address referenced by the virtual address input to the content-addressable memory.

Figure 2:
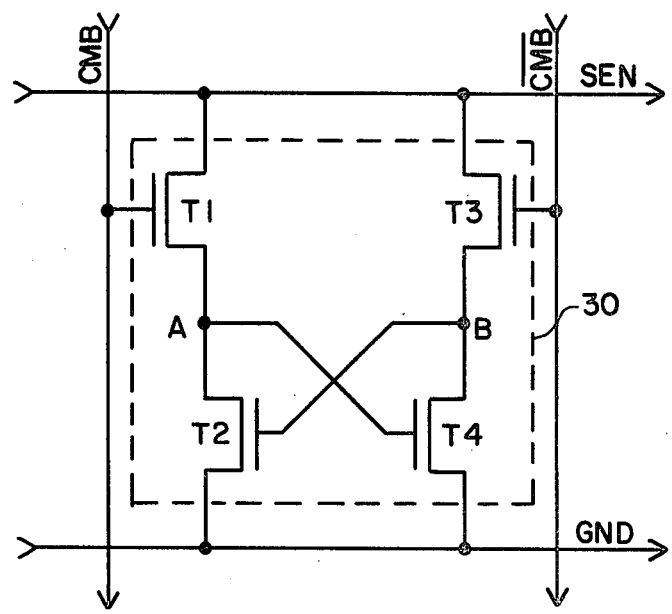
FIG. 2 is a detailed schematic diagram of one of the content-addressable memory (CAM) cells illustrated in FIG. 1.

FIG. 2 is a detailed schematic diagram of a content-addressable memory cell 30. As indicated above, the circuitry of all the content addressable memory cells in CAM array 20 are similar. Specifically, memory cell 30 comprises four (4) hard-enhancement transistors T1, T2, T3, and T4 having threshold voltages $V_{th}$ of approximately one (1) volt. Transistors T1 and T2 are coupled in series between sense line SEN and a ground line GND with transistor T2 coupled directly to ground line GND. Similarly, transistors T3 and T4 are serially coupled between sense line SEN and ground line GND with transistor T4 coupled directly to ground line GND. A node A between transistors T1 and T2 is coupled to the gate of transistor T4. A node B between transistors T3 and T4 is coupled to the gate of transistor T2. The gate of transistor T1 is coupled to a column line CMB and the gate of transistor T3 is coupled to a complementary column line $\overline{CMB}$. The width to lenth ratios (W/L) in microns, for transistor T1 and T3 are 3.5/10. For transistors T2 and T4, W/L=15/4.

In the preferred embodiment, the W/L of transistors T1 and T3 is 0.35 as compared to the W/L of transistors T2 and T4 which is 3.75. The ratio of W/L, which corresponds to the resistance ratio of transistor T1 to transistor T2, and similarily transistor T3 to T4, is approximately 1/10.7. This ratio is significantly greater than the $\frac{1}{3}$ or $\frac{1}{4}$ ratio used in typical inverter circuits. This relatively high ratio, which is preferably greater than 1/6, effectively reduces the possibility of a cell experiencing an undesired change in state during the comparison mode of operation.

Figure 3:
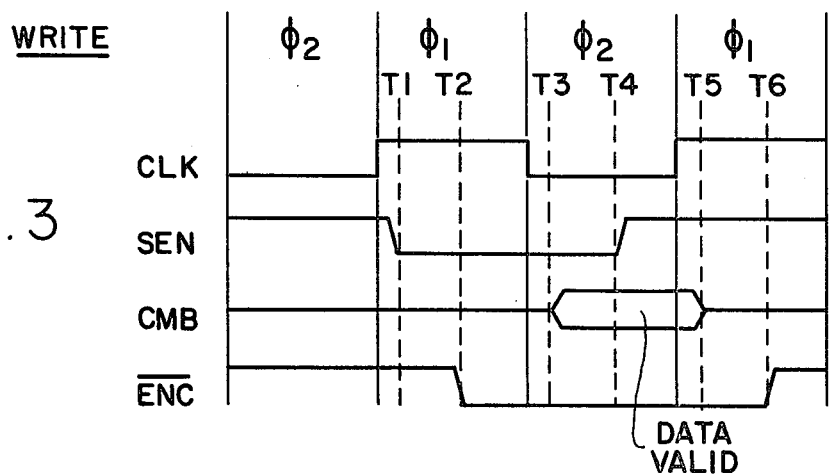
FIG. 3 is an illustration of the waveforms associated with the CAM cell of FIG. 2 in a write mode of operation.

In operation, memory cell 30 can operate in a number of different operating modes. In a write mode of operation, sense line SEN is grounded at time T1 during phase P1 as illustrated in waveform diagram FIG. 3. Compare bus lines CMB and $\overline{CMB}$ are held at non-forcing high-voltage levels by compare logic 10 during phase P1 which causes transistors T1 and T3 to conduct and nodes A and B to discharge to grounded sense line SEN. During the subsequent phase P2, complementary signals are applied to compare bus lines CMB and $\overline{CMB}$ in response to the value of the bit of the word to be stored. If the bit to be stored is a logical one, compare bus line CMB is held at a high voltage level by control logic 10, causing transistor T1 to conduct and compare bus line $\overline{CMB}$ is held at a zero voltage level turning transistor T3 off. At time t4, during the same phase P2, sense line SEN returns to a nonforcing high level (approximately two threshold voltages above ground) which charges node A to approximately one threshold voltage above ground. This voltage is sufficient to insure that transistor T4 is conducting and discharges node B. At time t5 during the sequent phase P1 the data levels on the compare bus lines CMB and $\overline{CMB}$ are returned to a nonforcing high level.

Figure 4:
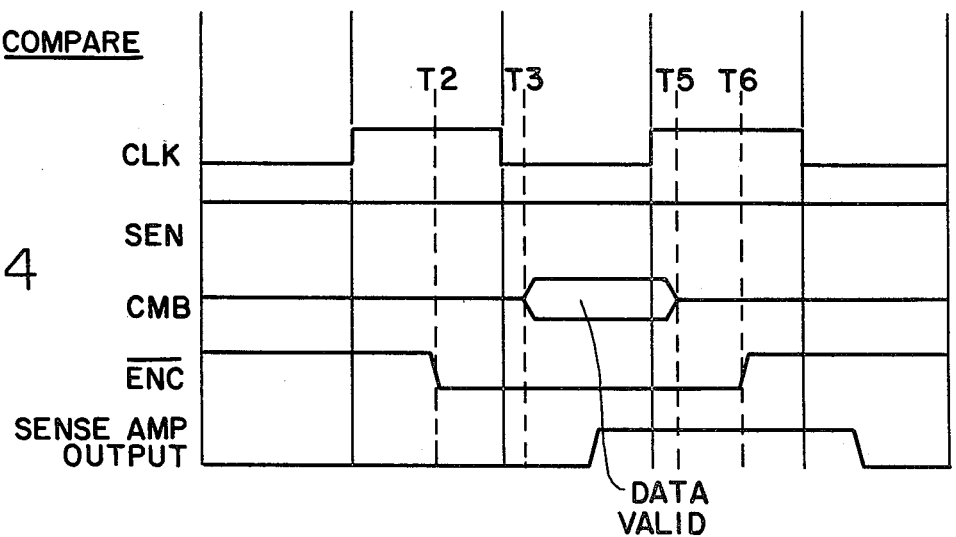
FIG. 4 is an illustration of waveforms associated with the CAM cell of FIG. 2 in a compare mode of operation.

FIG. 4 illustrates the waveforms associated with the compare mode of operation. In the compare mode of operation, sense line SEN is maintained at a nonforcing high level, which is sufficient to cause conduction in memory cell 30 without consuming an excess amount of power. Control logic 10 provides complementary data signals during phase P2 on compare bus lines CMB and $\overline{CMB}$ in response to the bits of a virtual address to be compared to the addresses stored in the content-addressable memory. Assuming the content-addressable memory cell 30 contains a logical "one" represented by a charge on node A, if the compare signal does not match the stored signal, as would be the case if data line $\overline{CMB}$ was logical "one", transistor T3 will conduct in response to the compare signal and transistor T4 will conduct in response to the charge on node A. This provides a current path from sense line SEN to ground line GND indicating a failure to match. Conversely, if no current flows in sense line SEN, a match between the virtual address on the INB bus and the stored data word associated with the sense line is indicated.

As illustrated, write and compare functions are implemented by using high speed pulses. These pulses must be short enough to maintain charge on Nodes A and B of the memory cell. Phases of less than one (1) millisecond should be short enough to meet this condition; however, since speed is a vital concern in CAM operation, the preferred embodiment uses phases of 50 to 100 nanoseconds. Thus, operating speeds are much faster than is necessary to prevent accidental changes of state as a result of Nodes A and B discharging during a write or compare operation.

Figure 5:
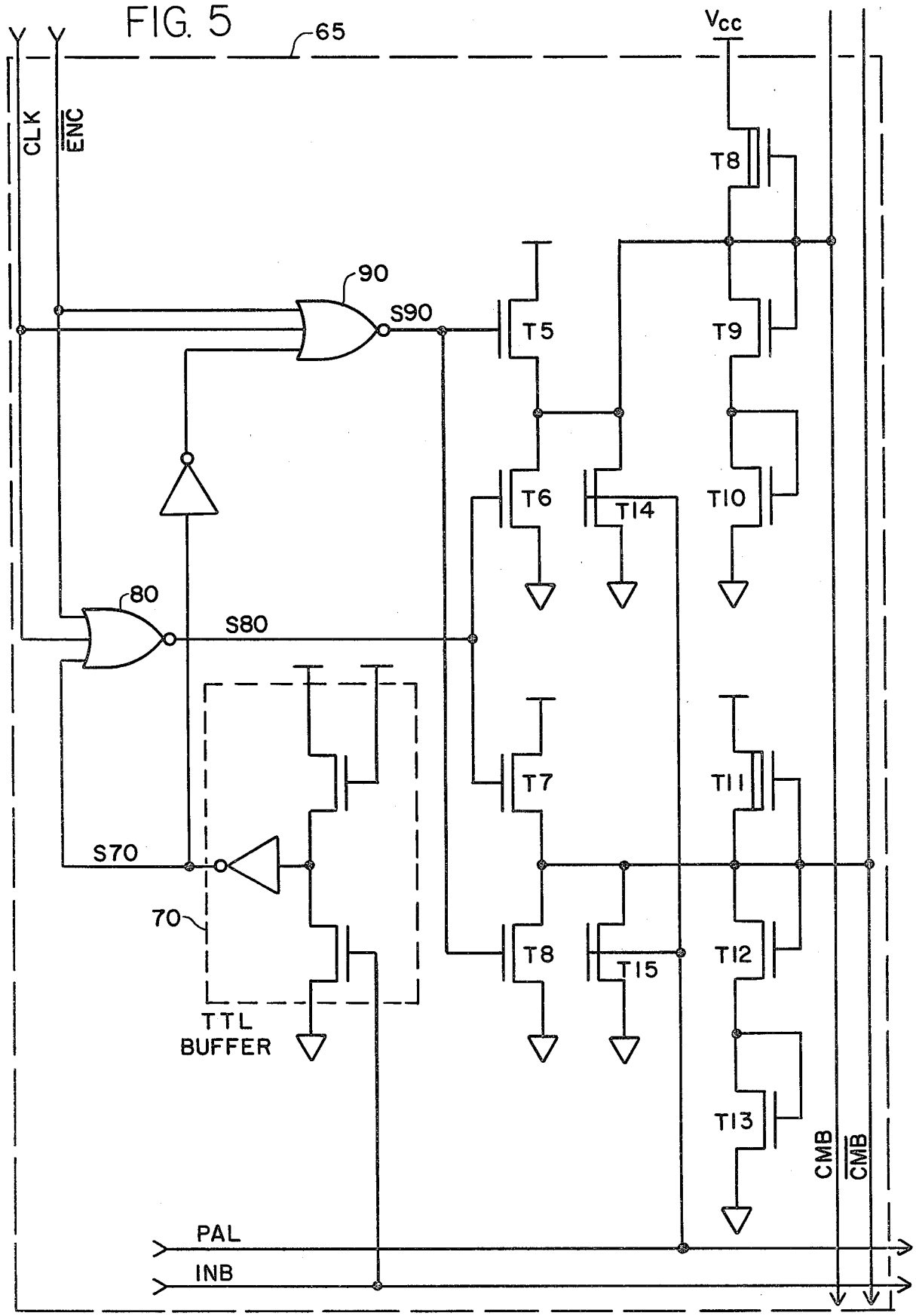
FIG. 5 is a detailed schematic diagram of one of the drive circuits of control logic circuit illustrated in FIG. 1.

A detailed schematic diagram of one drive circuit 65 of control logic 10 is provided in FIG. 5. Drive circuit 65 receives clock signal CLK which has alternately high and low logic values corresponding to phases P1 and P2. Drive circuit 65 is also coupled to control line $\overline{ENC}$ which provides a "not enable compare" signal. Drive circuit 65 provides complementary address signals on compare bus lines CMB and $\overline{CMB}$ in response to a signal having a low voltage on control line $\overline{ENC}$ and provides a nonforcing high voltage level on the control bus lines in response to a high voltage signal value on control line $\overline{ENC}$. The drive circuit 65, illustrated in FIG. 5, is the compare logic circuitry associated with one-bit of the virtual address and the corresponding control bus lines CMB and $\overline{CMB}$. In the present embodiment there are 16 similar circuits with one circuit coupled to each column of CAM array 20. Each of these circuits, except the circuit associated with the most significant bit of the virtual address, is also coupled to receive one-bit on the input bus INB and the "purge all lines" control signal PAL. The circuit associated with the most significant bit is also coupled to receive one-bit on the input bus INB, but is not coupled to receive control signal PAL. In operation, a high signal on control line PAL causes all of the compare bus lines to be pulled to ground except for the control bus lines associated with the most significant bit of the virtual address. Since the drive circuit of control logic 10 related to the most significant bit is not coupled to control line PAL it does not discharge the most significant compare bus lines in response to a control signal PAL.

More specifically, drive circuit 65 of control logic 10 receives a data bit on input bus INB and converts the data bit from a TTL signal to a MOS compatible signal in TTL buffer 70. TTL buffer 70 provides complementary signals to the inputs of NOR gates 80 and 90. In the compare mode of operation, control line $\overline{ENC}$ is low and a signal S70 applied by TTL buffer 70 to NOR gate 80 is high causing a signal S80 from NOR gate 80 to be low. The corresponding input to NOR gate 90 is low causing the output of NOR gate 90 to be high in response to a low value on clock input CLK during phase P2. The high level output from NOR gate 90 causes the push/pull circuit comprising transistors T5 and T6 to be active, and the low level output from NOR gate 80 causes the push/pull circuit comprising transistors T7 and T8 to be inactive. Transistors T5 and T6 thus cause control line CMB to be pulled to a high voltage level and transistors T7 and T8 cause control line $\overline{CMB}$ to be pulled down to low voltage level. Similarly, when the input data bit on the corresponding input bus INB line is a zero, the NOR gates and push/pull circuits will be activated in a complementary fashion during phase P2 and compare bus line $\overline{CMB}$ will have a low voltage level and compare bus line CMB will have a complementary high voltage level. If control signal ENC has a high voltage level both NOR gates 80 and 90 will provide low voltage level outputs which deactivate the push/pull circuits. In this event, the compare bus lines CMB and $\overline{CMB}$ are both biased to a nonforcing high voltage level of approximately two soft-enhancement threshold voltages by transistors T8, T9 and T10 and transistors T11, T12 and T13 respectively. Finally, in all except the drive circuit associated with the most significant bit, transistors T14 and T15 are coupled to discharge control bus lines CMB and $\overline{CMB}$ to ground in response to a high level signal on control line PAL.

Figure 6:
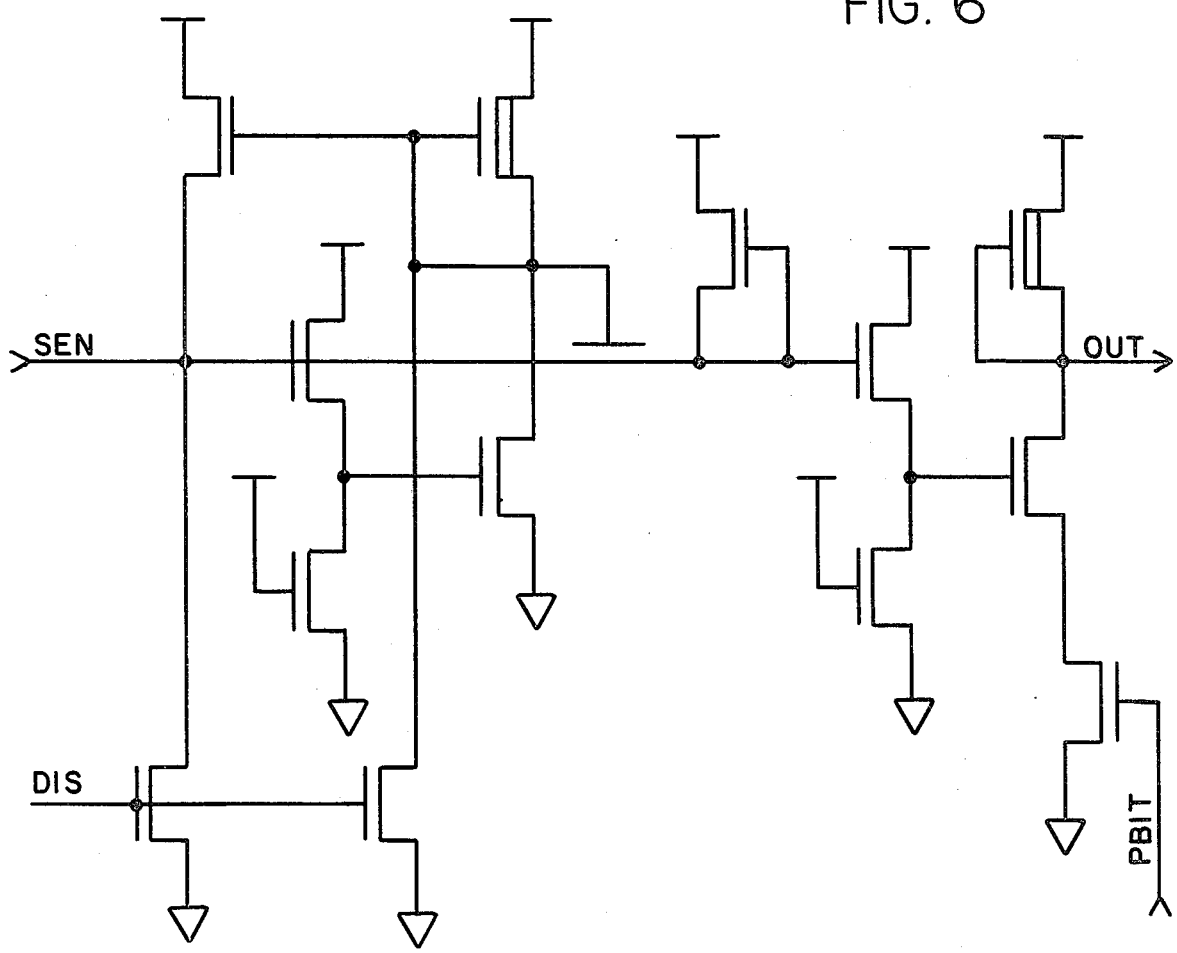
FIG. 6 is a detailed schematic diagram of the sense amplifier illustrated in FIG. 1.

Sense line amplifier 40 is illustrated in detailed schematic diagram FIG. 6. Sense line amplifier 40 is coupled to a control line DIS which selectively causes the sense amplifier to discharge sense line SEN to ground in response to a high voltage level signal. For instance, sense line SEN is discharged to ground during the write mode of operation. Sense amplifier 40 is also coupled to receive a signal on control line PBIT. If the signal on control line PBIT is a logical zero, the sense amplifier is deactivated and provides no output in response to any current on sense line SEN. The sense line amplifier 40 is activated in response to the signal on control line PBIT being a logical one. When activated, sense amplifier 40 provides an output which has a high voltage in response to a no current condition on sense line SEN and a low voltage in response to a current flowing on the sense line.

Figure 7:
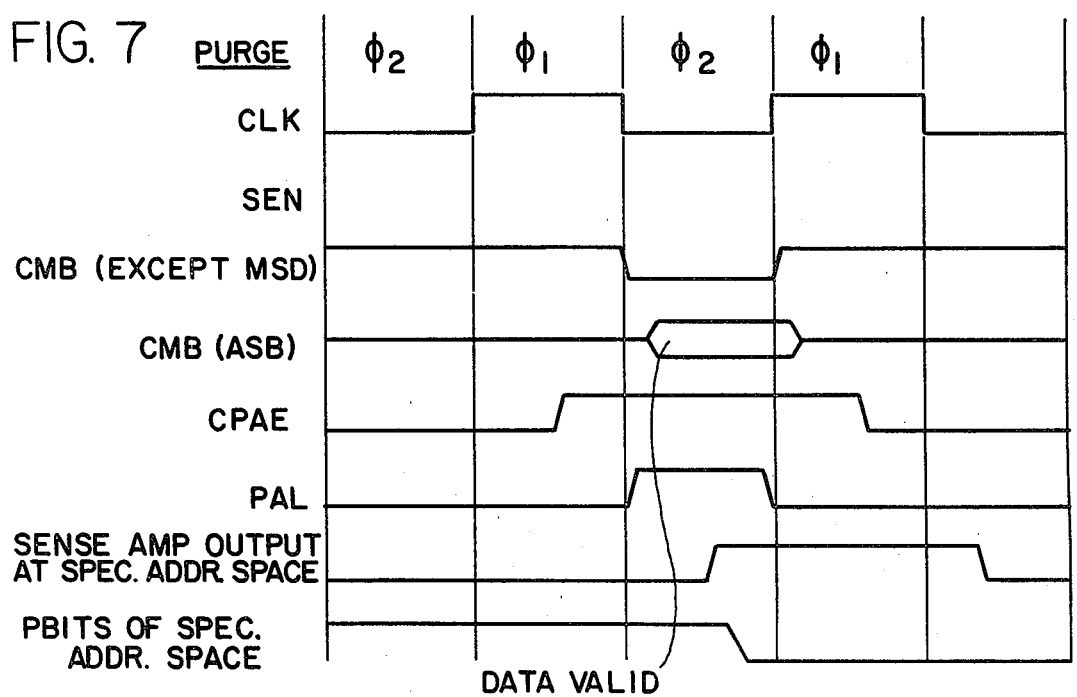
FIG. 7 is an illustration of waveforms associated with the CAM cell of FIG. 2 in a purge mode of operation.

The "purge entry" and "purge all entry" modes of operation are related to the resetting of the PBITS. PBIT logic 50 illustrated in FIG. 1 is coupled to reset a single PBIT associated with a virtual address stored in response to a high signal on the associated sense amplifier output and high level signal on control line CPRE. This operation is similar to a simple compare mode of operation with the exception that the signal on control line CPRE is set to a high level. The "purge all entry" mode of operation purges half of the PBITS in PBIT Logic 50 simultaneously. Specifically, all of the PBITS associated with either the most significant or the least significant stored data words are simultaneously reset to zero in response to the control signal CPAE as indicated in a waveform diagram FIG. 7. Control signal CPAE is brought to a high voltage level during phase P1. During the sequent phase P2, all of the compare bus lines CMB and $\overline{CMB}$ are brought to a low voltage level except for one compare bus line associated with the most significant bit of the stored virtual addresses not to be purged. This causes half of the sense amplifiers to be active simultaneously. The compare bus lines associated with the lesser significant bits are all pulled to ground in response to a PAL signal. The PBITS of the specified address space to be purged are reset to zero in response to the outputs from the active sense amplifiers and the occurrence of the control signal CPAE.

In the preferred embodiment of the present invention the voltage supply is approximately five volts. The circuitry utilizes three different types of MOS devices. Specifically, devices designated HE in FIG. 8 are hard enhancement devices having threshold voltages of approximately one volt. Soft enhancement devices (SE) have threshold voltages of approximately zero volts. Hard depletion devices (HD) have a threshold voltage of approximately $-2$ volts.

Preferred device types and sizes for the memory cell and control logic circuits are given in Table A. The width to length ratios are in microns.

TABLE A

| | W/L in $\mu$ | | |
|---|---|---|---|
| T1 | 3.5/10 | T8 | 20/3.5 |
| T2 | 15/4 | T81 | 8/9 |
| T3 | 3.5/10 | T9 | 25/6 |
| T4 | 15/4 | T10 | 25/6 |
| T5 | 40/3.5 | T11 | 8/9 |
| T6 | 20/3.5 | T12 | 25/6 |
| T7 | 40/3.5 | T13 | 25/6 |

In the preferred embodiment of the present invention sensing is performed on the supply or charging line. The compare bus is used to control write, compare and purge functions. Since the sensing is done on the same line SEN and not on the ground line GND the ground lines can be shortened between adjacent CAM cells, such as CAM cells on adjacent rows or columns, saving considerable amount of space when the content addressable memory is implemented in an integrated semiconductor circuit.

While the invention has been particularily taught and described with reference to the preferred embodiment, those versed in the art will appreciate that minor modifications in form and detail may be made without departing from the spirit and scope of the invention. Accordingly, all such modifications are embodied within the scope of this patent as properly come within any contribution to the art and are particularily pointed out by the following claims.

I claim:

1. A content addressable memory having an array of memory cells comprising:
   a first sense line associated with a first plurality of memory cells associated with a stored data word;
   a ground line;
   each memory cell comprising a first transistor coupled to the sense line and a second transistor serially coupled between the first transistor and the ground line, a third transistor coupled to the sense line and a fourth transistor serially coupled between the third transistor and the ground line, wherein the node between the first and second transistors is coupled to the gate of the fourth transistor and the node between the third and fourth transistors is coupled to the gate of the second transistor;

first and second compare line means for providing compare signals in response to a data bit of an address to be compared to the stored data word, the first compare line means coupled to the gate of the first transistor and the second compare line means coupled to the gate of the third transistor; and means for providing a match signal in response to sensing no current on the first sense line.

2. A content addressable memory as in claim 1 wherein a second plurality of memory cells associated with another stored data word share the ground line with the first plurality of memory cells and are coupled to a second sense line.

3. A content addressable memory cell as in claim 1 wherein the ratios of the width-to-length of the first and third transistors are less than one-sixth the ratio of the width-to-length of the second and fourth transistors.

4. A content-addressable memory as in claim 1 or 2 or 3 further comprising means for selectively applying either a first voltage or a ground voltage to the first sense line.

5. A content-addressable memory as in claim 4 wherein the first voltage is substantially equal to the sum of the threshold voltages of the first and second transistors.

6. A content-addressable memory circuit as in claim 5 further comprising means for selectively providing an output signal in response to the match signal and a control bit and further comprising means for selectively setting the control bit in response to the match signal.

7. A content-addressable memory circuit as in claim 1 further comprising a plurality of rows of memory cells, each row of memory cells corresponding to a stored data word and coupled to a common sense line and a common ground line, the memory cells coupled to the first and second compare line means in logical columns corresponding to search words, each sense line having means for providing a match signal in response to sensing no current on the sense line, the circuit further comprising means associated with each sense line for providing an output signal in response to the match signal and a control bit and further comprising means for selectively setting the control bit in response to the match signal; the circuit further comprising means for forcing all compare lines associated with a number of the least significant bits to a low voltage level causing a plurality of match signals to occur simultaneously while setting the control bits.

8. The method of operating a content-addressable memory cell comprising two cross-coupled inverters, the cell being one of a plurality of cells in a CAM array, the memory cells coupled in logical rows and columns, each row of cells corresponding to a stored data word and coupled to a common sense line and a common ground line, and each column of cells corresponding to a search word and coupled to receive complementary signals responsive to the search word, the method comprising the steps of:

storing a bit of data by discharging the sense line and applying complementary signals to the inputs of the inverters representative of the bit of data to be stored; and comparing the stored bit of data to a search bit by applying a voltage greater than two threshold voltages to the sense line, applying complementary signals to the inputs of the inverters representative of the bit of data to be compared and providing a match signal in response to the absence of a current flowing through the supply line.

9. The method of operating a content-addressable memory cell as in claim 8 wherein the voltage applied to the sense line during the step of comparing and during a static mode of operation wherein no signals are applied to the inverter inputs is substantially equal to two threshold voltages.

10. A method of operating a content addressable memory cell as in claim 8 or 9 further comprising the step of selectively providing an output signal in response to the match signal and a control bit.

11. A method of operating a content-addressable memory cell as in claim 10 further comprising the step of selectively setting the control bit in response to the match signal.

12. A method of operating a content-addressable memory cell as in claim 11 further comprising the step of forcing all compare lines associated with a number of least significant bits low causing a plurality of selected match signals to occur while setting the control bits.

* * * * *